United States Patent [19]
Tsai

[11] Patent Number: 5,978,306
[45] Date of Patent: Nov. 2, 1999

[54] MEMORY DEVICE HAVING A REDUNDANT MEMORY BLOCK

[76] Inventor: Hsi-Jung Tsai, 6F, No. 144, Shuang-Feng Rd., Shuang-Hsi Tsun, Pao-Shan Hsiang, Hsinchu Hsien, Taiwan

[21] Appl. No.: 09/191,805

[22] Filed: Nov. 13, 1998

[51] Int. Cl.[6] ................................................. Q11C 13/00
[52] U.S. Cl. .............................. 365/230.03; 365/230.02; 365/230.04
[58] Field of Search ......................... 365/189.03, 230.02, 365/230.03, 230.04, 230.06

[56] References Cited

U.S. PATENT DOCUMENTS 5,499,216  3/1996  Yamamoto ..................... 365/230.03

Primary Examiner—Terrell W. Fears
Attorney, Agent, or Firm—J.C. Patents; Jiawei Huang

[57] ABSTRACT

A memory device having a redundant memory block according to the invention is disclosed. The memory device includes a main memory block, a redundant memory block, a first decoder, a second decoder and an address control circuit. The address control circuit is used to set an address corresponding to another address where a certain defective byte of memory bytes is located. When an external address signal is identical to the address set by the address control circuit, the address is transferred to a redundant memory block, so that the defective byte of memory cells can be replaced with a spare byte of memory cells, thereby increasing manufacturing yield.

19 Claims, 5 Drawing Sheets

MEMORY DEVICE HAVING A REDUNDANT MEMORY BLOCK

CROSS-REFERENCE TO RELATED APPLICATION

This application claims the priority benefit of Taiwan application Ser. No. 87115562, filed Sep. 18, 1998, the full disclosure of which is incorporated herein by reference.

BACKGROUND OF THE INVENTION

1. Field of the Invention

The invention relates to a memory device, and more particularly to a memory device having a redundant memory block.

2. Description of the Related Art

FIGS. 1A and 1B are a circuit diagram and an address and data arrangement of a conventional memory device, respectively.

As shown in FIGS. 1A and 1B, a storage capacity of 1K×8 bits is taken as an example. In this case, 10 address lines $A_0$–$A_9$ are required to address an entire main memory block (MMB) 113 via a row decoder 111 and a column decoder 112, wherein address lines $A_0$–$A_4$ are electrically connected to the row decoder 111 while address lines $A_5$–$A_9$ are electrically connected to the column decoder 112.

During memory device (such as random access memories (RAM)) manufacture, defects on several memory cells of memory devices can cause themselves and even the entire memory devices to function abnormally, resulting in low manufacturing yield. The more storage capacities the memory devices have, the higher density the memory devices will have. As a result, the probability of defects on memory devices is greatly increased, leading to low manufacturing yield. In order to improve manufacturing yield, a redundant memory block (RMB) is designed in each memory device. Thus, defective parts of memory cells in memory devices can be replaced with spare memory cells in the redundant memory block so as to maintain better manufacturing yield.

FIG. 2 is a circuit block diagram showing a memory device 210 having a redundant memory block 214 according to the prior art. As shown in FIG. 2, in addition to a main memory block 213, the memory device 210 includes a redundant memory block 214. The redundant memory block 214 consists of a plurality of rows of memory cells. When there are defects on parts of one row of memory cells in the main memory block 213, a spare row of memory cells in the redundant memory block 214 is used to replace the defective row of memory cells.

Referring further to FIG. 2, an address signal IA is input to access data stored in a corresponding row of memory cells of the memory device 210. At this time, if the corresponding row of memory cells is normal, it can be correctly addressed by the address signal IA via a row decoder 211 and a column decoder 212. Inversely, if the row of memory cells is abnormal, the row decoder 211 is disabled after the address signal IA is compared by an address comparator 220, and then a spare row of memory cells in the redundant memory block 214 is selected to replace the defective row of memory cells. Consequently, the memory device 210 having the redundant memory block 214 can function normally even though the main memory block 213 has local defects, thereby improving manufacturing yield.

However, the unit of the redundant memory block 214 is estimated by row. Under this circumstance, if there is only one memory cell with defect in a row of memory cells of the main memory block 213, the entire row of memory cells must be replaced with a spare row of memory cells selected from the redundant memory block 214. Therefore, the problem with how many redundant memory cells should be reserved during memory device designs is faced. Now, taking a 1K×8-bit memory device as an example, a row decoder can be used to address one of 32 rows of memory cells. Under the worst condition that each row of memory cells has only one defective memory cell, it is necessary to have 32 rows of redundant memory cells for replacement. As a result, the areas of the main memory block 213 and the redundant memory block 214 must have a ratio of 1:1. It is obviously unpractical.

SUMMARY OF THE INVENTION

In view of the above, an object of the invention is to provide a memory device having a redundant memory block of which the unit is estimated by byte. Thus, the redundant memory block can be efficiently and completely used.

To attain the above-stated object, the memory device having a redundant memory block includes a main memory block, a redundant memory block, a first decoder, a second decoder, a multiplexer, a block selecting circuit, a plurality of address setting circuits and a redundant address generating circuit.

Together, the first decoder and the second decoder are electrically coupled to the main memory block and the redundant memory block. The first decoder receives a first address signal while the second decoder receives the first address signal and a block selecting signal which includes either a first state or a second state. When the block selecting signal is at a first state, the column decoder selects the main memory block. Inversely, when the block selecting signal is at a second state, the column decoder selects the redundant memory block.

The multiplexer which is controlled by a redundant selecting signal receives a second address signal and a third address signal and transmits the first address signal. When the redundant selecting signal is deactivated, the multiplexer selects the second address signal as the first address signal. On the contrary, when the redundant selecting signal is activated, the multiplexer selects the third address signal as the first address signal.

The block selecting circuit receives the redundant selecting signal and transmits the block selecting signal to the second decoder. When the redundant selecting signal is deactivated, the block selecting signal is at a first state. Oppositely, when the redundant selecting signal is activated, the block selecting signal is at a second state.

The address setting circuits are used to generate a plurality of redundant setting address signals, respectively. The redundant address generating circuit is electrically coupled to the address setting circuits, the block selecting circuit and the multiplexer for receiving the external redundant setting address signals and transmitting the third address signal and the redundant selecting signal. When the second address signal is identical to one of the redundant setting address signals, the corresponding third address signal is output and the redundant selecting signal is activated.

The memory device further includes a redundant setting circuit for transmitting a redundant enable/disable signal to activate/deactivate the redundant address generating circuit. When the redundant enable/disable signal is activated, the redundant address generating circuit is enabled.

The redundant address generating circuit includes a plurality of comparators, an address coder and an address selective control circuit.

Each comparator is used to receive a redundant setting address signal output from a corresponding address setting circuit and the second address signal and to transmit a result signal. When the redundant setting address signal of the corresponding address setting circuit is identical to the second address signal, the result signal is activated. An address coder receives the result signal of each comparator and then transmits the third address signal to the multiplexer. The address selective control circuit also receives the result signal of each comparator and then transmits the redundant selecting signal to the multiplexer. When one of the result signals coming from the comparators is activated, the redundant selecting signal is activated.

The address selective control circuit further receives a redundant enable/disable signal output from the redundant setting circuit. Following the activation of the redundant enable/disable signal, the address selective control circuit is activated.

The result signal of each comparator, the redundant enable/disable signal and the redundant selecting signal are activated at a high potential. The address selective control circuit includes an OR gate and an AND gate. The OR gate has a plurality of input terminals to receive the result signals coming from the comparators. The AND gate has two input terminals for receiving the output signal of the OR gate and the redundant enable/disable signal and transmitting the redundant selecting signal.

The block selecting circuit, a second multiplexer, is controlled by the redundant selecting signal and has two input terminals to receive a first signal being at a first state and a second signal being at a second state. When the redundant selecting signal is deactivated, the second multiplexer selects the first signal as the block selecting signal. Inversely, when the redundant selecting signal is activated, the second multiplexer selects the second signal as the block selecting signal.

BRIEF DESCRIPTION OF THE DRAWINGS

The invention will be more fully understood from the detailed description given hereinbelow and the accompanying drawings which are given by way of illustration only, and thus do not limit the present invention, and wherein.

DETAILED DESCRIPTION OF THE PREFERRED EMBODIMENTS

Figure 3:
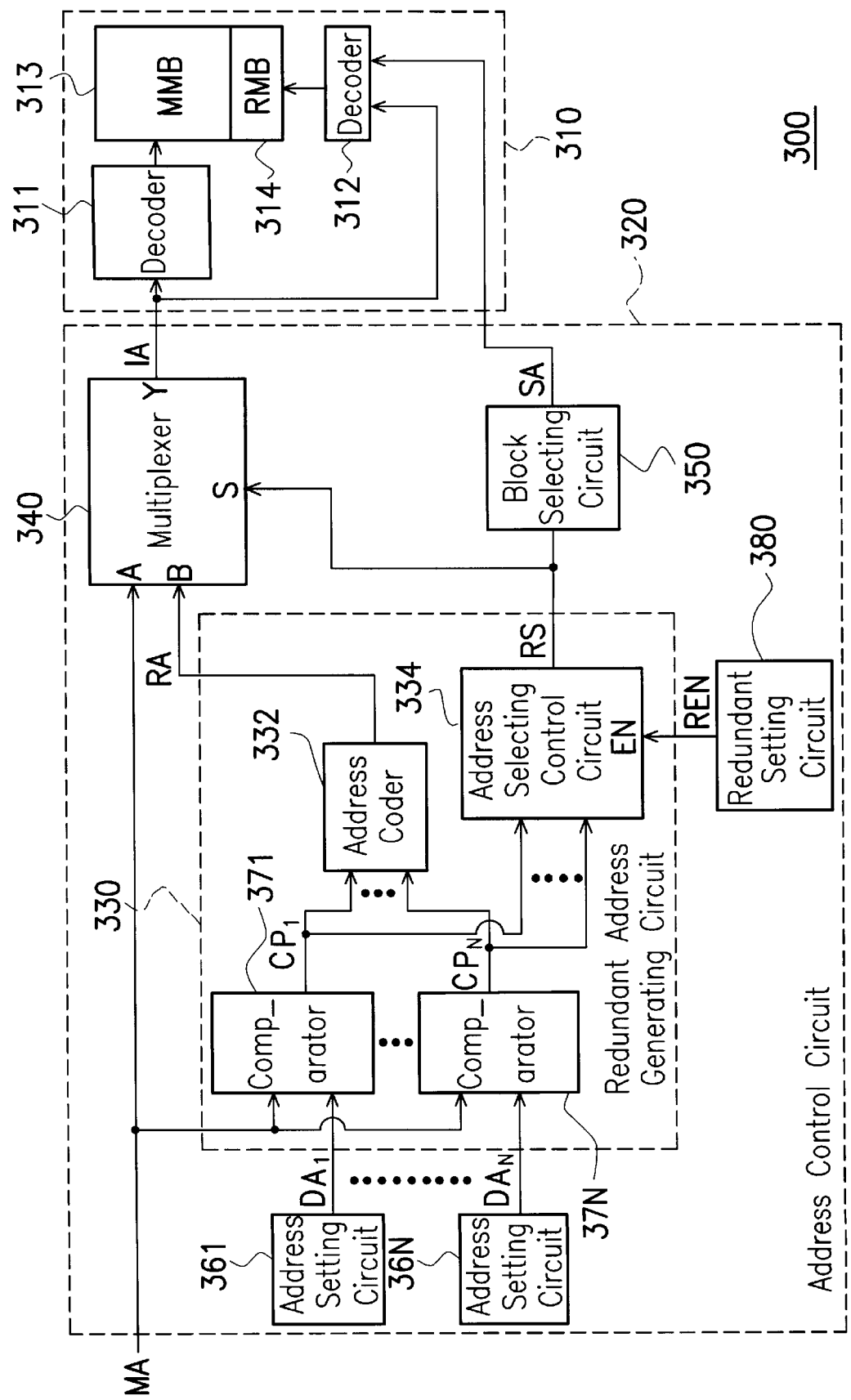
FIG. 3 is a circuit block diagram showing a memory device having a redundant memory block according to the invention.

FIG. 3 is a circuit block diagram showing a memory device 300 having a redundant memory block 314 according to a preferred embodiment of the invention. As shown in FIG. 3, the memory device 300 includes a memory array 310 and an address control circuit 320. The memory array 310 is mainly used to store required data. The address control circuit 320 is used to generate an internal address signal IA and a block selecting signal SA to access corresponding data stored in the memory array 310 based on an external address signal MA.

In generally, a main memory block (MMB) 313 included in the memory array 310 are mainly used to stored required data under a normal condition. Similarly, to prevent defective memory cells in the main memory block 313 from affecting the function of the entire memory device 300 as stated in the prior art, the memory device 300 are designed with a redundant memory block (RMB) 314. Once parts of memory cells in the main memory block 313 are defective, corresponding spare memory cells in the redundant memory block 314 are selected to replace the defective memory cells, thereby maintaining the entire memory device 300 at a normal operation. The decoders 311 and 312 decode the address signal IA into a row decoded signal and a column decoded signal which are sued to select a corresponding access address. Typically, the decoder 311 serves as a row decoder, and the decoder 312 serves as a column decoder. Basically, the definition of the row and column decoders depends on practical circuit designs. Moreover, the main memory block 313 and redundant memory block 314 share the decoders 311 and the 312 together. The decoder 311 receives the address signal IA coming from the address control circuit 320 and then transmits the row decoded signal to select a corresponding row of memory cells from the main memory block 313 or the redundant memory block 314. The decoder 312 receives not only the address signal IA, but also the block selecting signal SA coming from the address control circuit 320 and transmits a column decoded signal to select a corresponding column of memory cells from the main memory block or the redundant memory block. The block selecting signal SA is also decoded by the decoder 312. In addition, the address signal IA is transmitted on a plurality of address lines, and the decoder 311 and 312 are electrically connected parts of the address lines. For example, the address signal IA, a 10-bit signal, is transmitted on 10 address lines $IA_0-IA_9$, and the decoders 311 and 312 are electrically connected to address lines $IA_0-IA_4$ and address lines $IA_{5-IA9}$, respectively. The block selecting signal SA is used to select one of the main memory block 313 and the redundant memory block 314. For example, the block selecting signal SA is a one-bit selecting signal. In this case, the main memory block 313 is selected when the block selecting signal SA is at a logic level 0 while the redundant memory block 314 is selected when the block selecting signal SA is at a logic level 1.

Normally, a corresponding access address in the main memory block is selected based on the address signal MA. However, if several memory cells in the corresponding access address suffer from defects, a replacement access address in the redundant memory block is selected by converting the address signal MA via the address control circuit 320 and the decoders 311 and 312. Thus, the entire memory device 300 can function well even though there are defects on certain memory cells of the main memory block.

Additionally, the address control circuit 320 includes a multiplexer 340, a block selecting circuit 350, address setting circuits 361–36N, a redundant address generating circuit 330 and a redundant setting circuit 380.

The multiplexer 340 has two input terminals A and B to receive the external address signal MA and an address signal RA output from the redundant address generating circuit 330. The multiplexer 340 has an output terminal Y to transmit the address signal IA. Moreover, the multiplexer 340 is controlled by the redundant selecting signal RS. When the redundant selecting signal RS is deactivated, for example, at a logic level 0, the multiplexer 340 selects the external address signal MA as the address signal IA. Inversely, when the redundant selecting signal RS is activated, for example, at a logic level 1, the multiplexer 340 selects the address signal RA as the address signal IA.

The block selecting circuit 350 receives the redundant selecting signal RS output from the redundant address generating circuit 330 and transmits the block selecting signal SA to the decoder 312 to select one of the main memory block 313 and the redundant memory block 314. When the redundant selecting signal RS is deactivated, the block selecting signal SA is set at, for example, a logic level 0, so as to select the main memory block 313 via the decoder 312. On the contrary, when the selecting signal RS is activated, the block selecting signal SA is set at, for example, a logic level 1 so as to select the redundant memory block 314 via the decoder 312.

The address setting circuits 361–36N are used to generate various redundant setting address signals $DA_1$–$DA_N$ based on addresses where detective memory cells in the main memory block 313 are located. The redundant address generating circuit 330 receives the redundant setting address signals $DA_1$–$DA_N$ and the external address signal MA. When the address signal MA is identical to one of the redundant setting address signals $DA_1$–$DA_N$, the redundant address generating circuit 330 transmits the corresponding address signal RA and the redundant selecting signal RS which is activated. At this point, the multiplexer 340 selects the address signal RA as the address signal IA, and the block selecting signal SA is set at, for example, a logic level 1 thereby to select the redundant memory block 314.

The redundant enable/disable signal REN output from the redundant setting circuit 380 is connected to the enable terminal EN of the address selecting control circuit 334 for enabling/disabling the redundant address generating circuit 330. When the redundant enable/disable signal REN is activated, for example, at a logical level 1, the redundant address generating circuit 330 is enabled. Inversely, when the redundant enable/disable signal REN is deactivated, for example, at a logic level 0, the redundant address generating circuit 330 is disabled. Accordingly, there is no need to use spare memory cells in redundant memory block 314 if the main memory block 313 can function normally after the memory device 300 is completed manufactured. At this time, the redundant address generating 330 is disabled by the redundant setting circuit 380.

Furthermore, referring to FIG. 3, the redundant address generating circuit 330 includes comparators 371–37N, an address coder 332 and an address selecting control circuit 334.

The comparators 371–37N receives the redundant setting address signals $DA_1$–$DA_N$ output from the address setting circuits 361–36N, respectively, and the external address signal MA and transmits result signals $CP_1$–$CP_N$. As an example, if the redundant setting address signal $DA_1$ coming from the address setting circuit 361 is identical to the external signal MA, the result signal output $CP_1$ from the comparator 371 is activated. The other comparators have the same operation as described above. Since the redundant setting address signals $DA_1$–$DA_N$ are various from each other, only one comparator outputs an activated result signal while the other comparators output deactivated result signals.

The result signals $CP_1$–$CP_N$ are concurrently transmitted to the address coder 332 and the address selecting circuit 334 from the comparators 371–37N. Then, the address coder 332 generates the corresponding address signal RA based on which one of the result signals $CP_1$–$CP_N$ is activated. The address selecting control circuit 334 determines the state of the redundant selecting signal RS according to the result signals $CP_1$–$CP_N$ and the redundant enable/disable signal REN. When the redundant enable/disable signal REN and one of the result signals $CP_1$–$CP_N$ are activated, the redundant selecting signal RS is activated. At this time, the multiplexer 340 selects the address signal RA output from the address coder 332 as the address signal IA which is then transmitted to the memory array 310.

Figure 4:
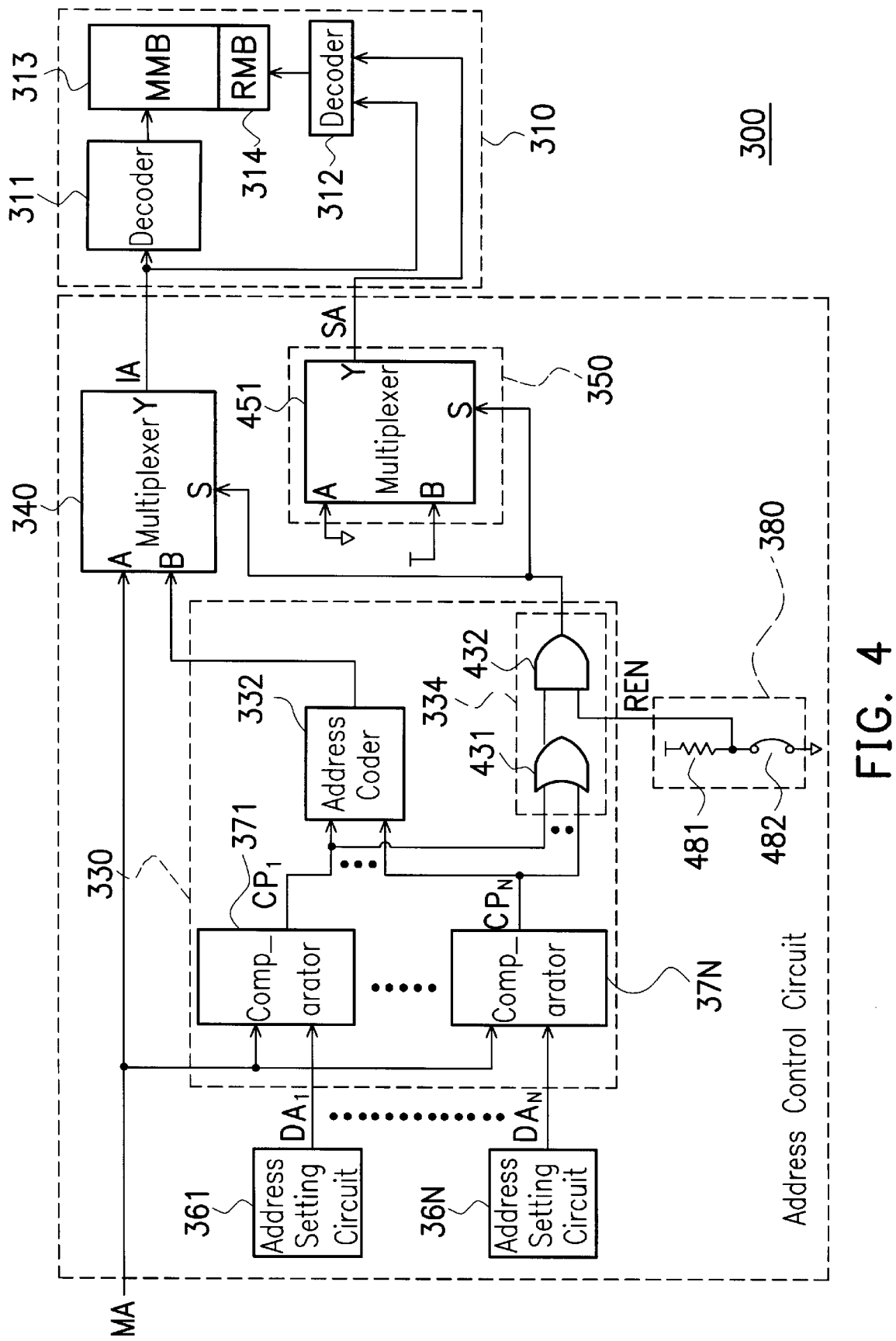
FIG. 4 is a detailed circuit block diagram of FIG. 3.

FIG. 4 is a detailed circuit block diagram of FIG. 3. In FIG. 4, the address selecting control circuit 334 consists of an OR gate 431 and an AND gate 432 while the redundant setting circuit 380 consists of a pull-up resistor 481 and a fuse 482 which can be broken off by laser. Furthermore, the block selecting circuit 350 consists of a multiplexer 451 both input terminals of which are electrically connected to a high potential and ground potential, respectively.

Similarly, in coordination with the address selecting control circuit 334 and the redundant setting circuit 380, any one of the result signals $CP_1$–$CP_n$ is activated at a high logic level, the redundant enable/disable signal REN is activated at a high logic level, and the redundant selecting signal RS is activated at a high logic level.

The result signals $CP_1$–$CP_N$ output from the comparators 371–37N all are connected to the input terminals of the OR gate 431. Therefore, when one of the result signals CP1–CPN is activated at a high logic level, the output terminal of the OR gate 431 is set at a high logic level. At the same time, the fuse 482 in the redundant setting circuit 380 is broken off so as to pull up the potential of the enable/disable signal REN to a high logic level by the resistor 481. Since both input terminals of the AND gate 432 all are at high logic levels, the output terminal of the AND gate 432 is set at a high logic level. At this point, the multiplexer 340 controlled by the redundant selecting signal RS selects and outputs the address signal RA from the output terminal Y thereof.

The multiplexer 451 constituting the block selecting circuit 350 has input terminals A and B electrically coupled to the ground potential and high potential, respectively and an output terminal Y to output the block selecting signal SA to the decoder 312. When the redundant selecting signal RS is deactivated at a low logic level, the multiplexer 451 selects the ground potential of the input terminal A as the block selecting signal SA. At this time, the main memory block 313 is addressed via decoder 312. Oppositely, when the redundant selecting signal RS is activated at a high logic level, the multiplexer 451 selects the high potential of the input terminal B as the block selecting signal SA. At this time, the redundant memory block 314 is addressed via the decoder 312.

Figures 1A, 1B:
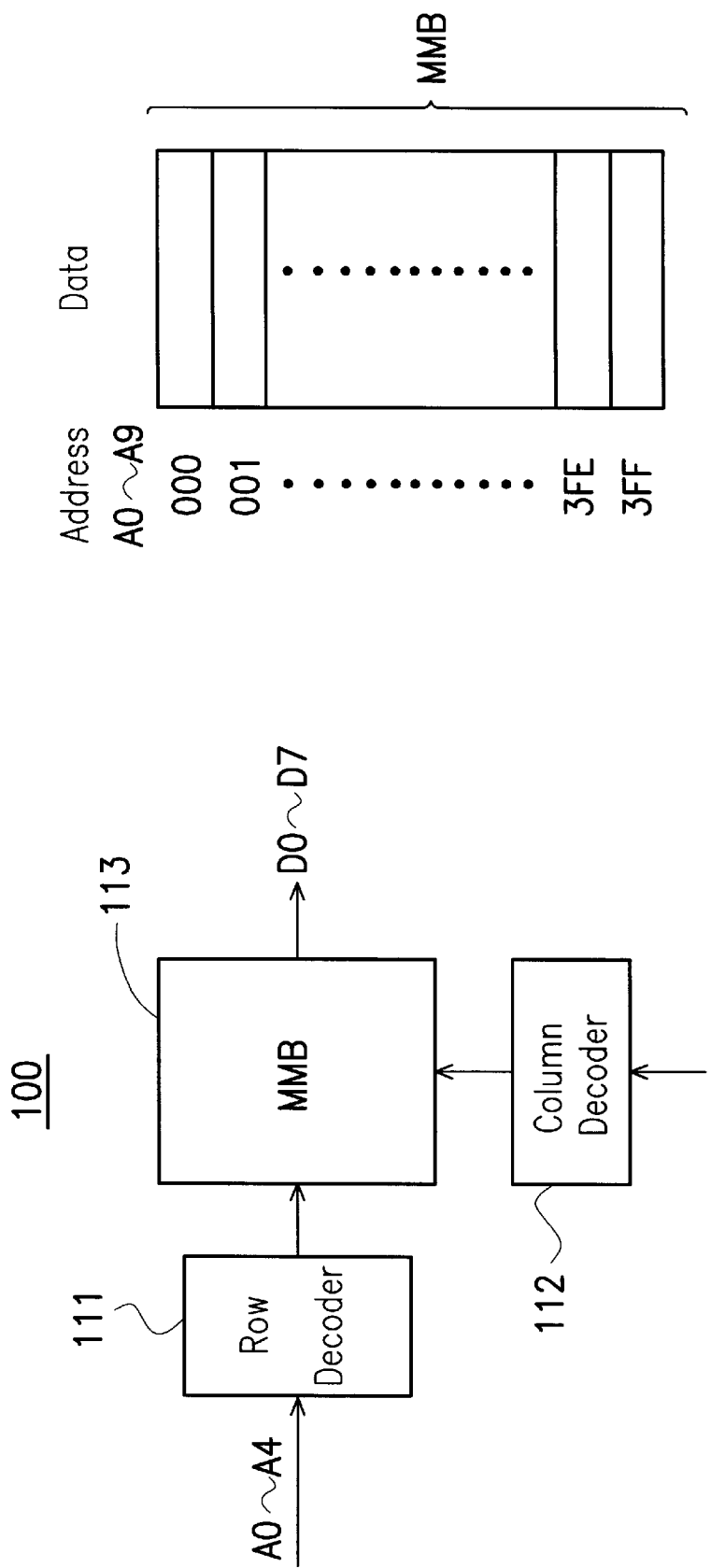
FIG. 1A is a circuit block diagram showing a conventional memory.
FIG. 1B is a schematic view showing the address and data arrangement of a convention memory.
Figure 5:
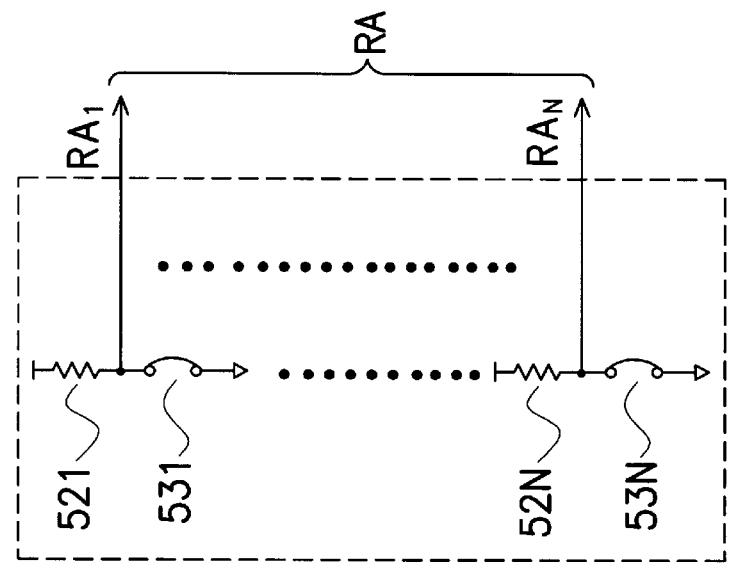
FIG. 5 is a circuit diagram showing an address setting circuit of FIG. 3 and FIG. 4.
Figure 2:
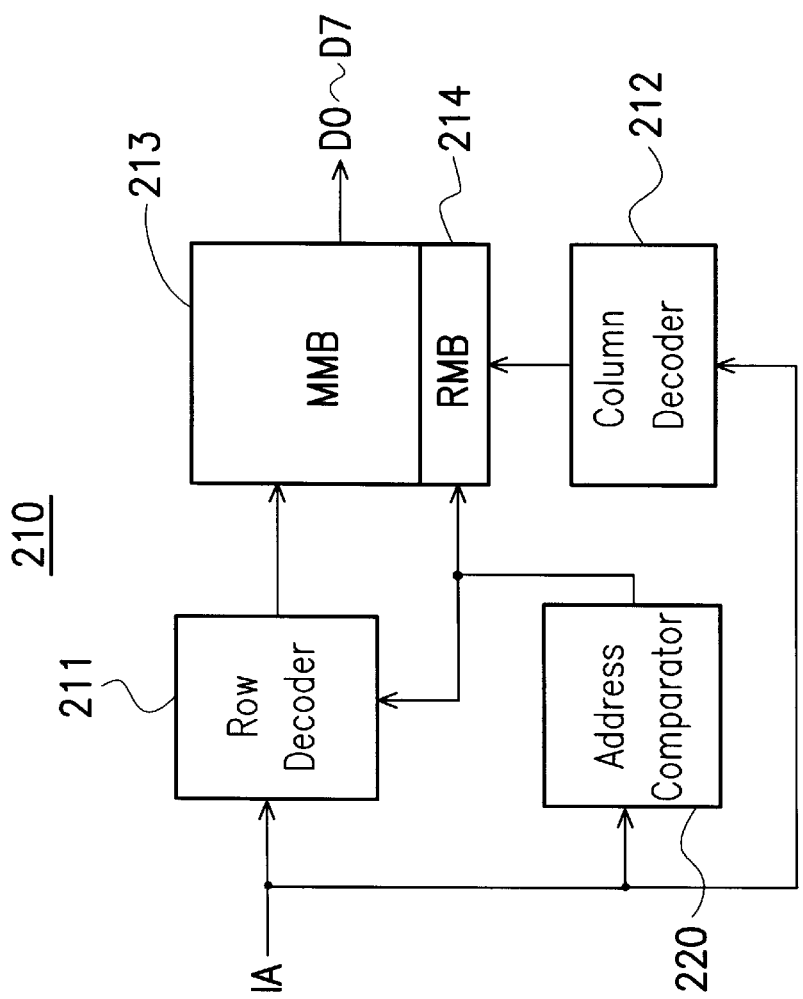
FIG. 2 is a circuit block diagram showing a memory device having a redundant memory block according to the prior art.

The address setting circuits 361–36N are used to generate the redundant setting address signals corresponding to defective memory cells in the main memory block 313. FIG. 5 is a circuit diagram showing each address setting circuit.

As shown in FIG. 5, each address setting circuit consists of a plurality of pairs of pull-up resistors 521–52N and fuses 531–53N which can be broken off by laser. Taking the pair of resistor 521 and fuse 531 as an example, when the fuse 531 is not broken off, the potential of a corresponding signal line RA1 is pull down to the ground potential considered as a logic level 0 by the fuse 531. Inversely, when the fuse 531 is broken off, the potential of the signal line RAI is pull up to a high potential considered as a logical level 1 by the resistor 521. The other pairs of resistors and fuses have the same operation as described above. Accordingly, a corresponding address signal RA is determined by setting the potentials of the signal lines $RA_1$–$RA_N$ based on whether the fuses 531–53N are broken off.

Figure 6B:
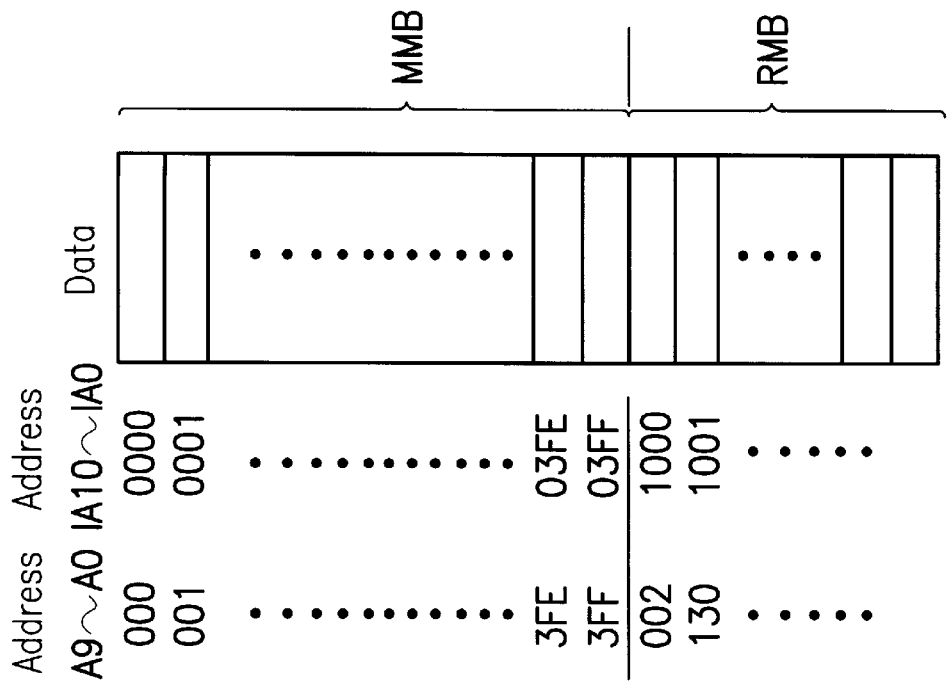
FIG. 6B is a schematic view showing the address and data arrangement of the memory array of FIG. 6A.
Figure 6A:
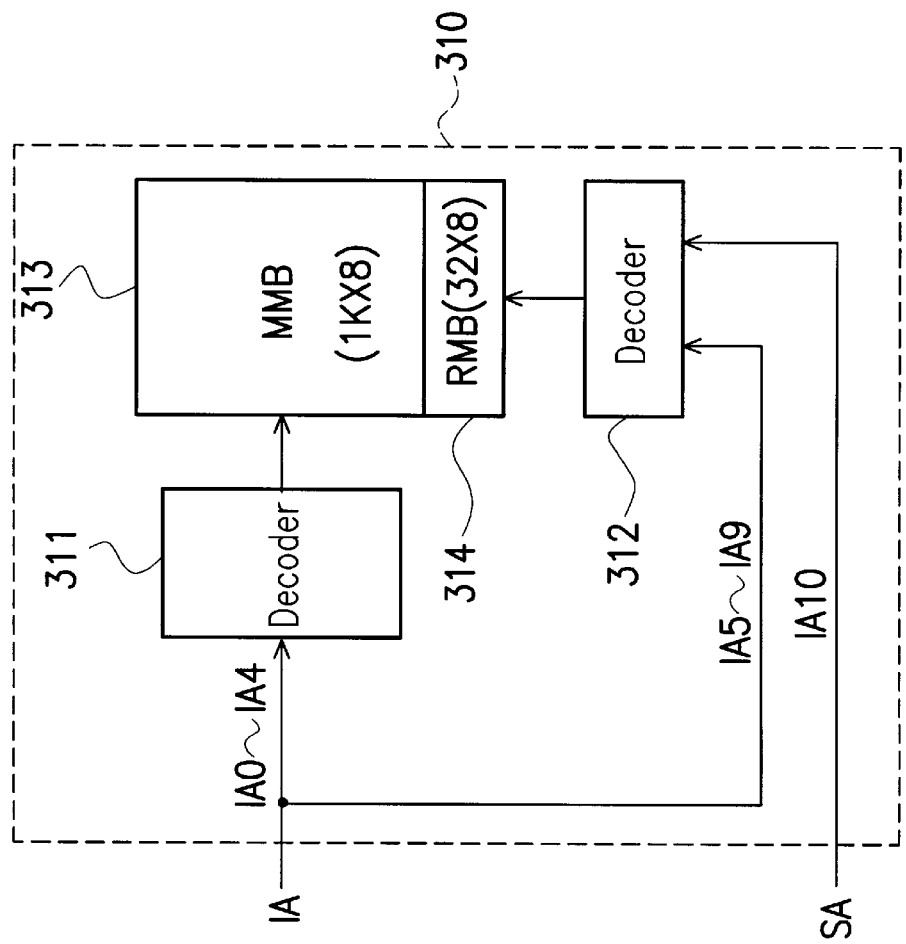
FIG. 6A is a block diagram showing a memory array of FIG. 3 and FIG. 4.

FIG. 6A is a circuit block diagram showing the memory array 310 of FIG. 3 and FIG. 4, and FIG. 6B is a schematic view showing the address and data arrangement of the memory array 310 of FIG. 6A. Referring to FIG. 6A for further describing the operation of the redundant memory block 314, the storage capacities of the main memory block 313 and the redundant memory block 314 are 1K×8 bits and 32×8 bits, respectively. Since each address can store 8-bit data, it is necessary to have 10 address lines $IA_0$–$IA_9$ for transmitting the address signal IA, wherein 5 address lines $IA_0$–$IA_4$ are electrically connected to the decoder 311 for addressing 32 rows of memory cells, and 5 address lines $IA_5$–$IA_9$ are electrically connected to the decoder 312 for addressing 32 columns of memory cells. Accordingly, any address in the main memory block 313 can be selected via the decoders 311 and 312. The block selecting signal SA transmitted to the decoder 312 for selecting one of the main memory block 313 and the redundant memory block 314 are considered as an address line $IA_{10}$. When the address line $IA_{10}$ is at a logic level 0, the decoder 312 selects a column of memory cells in the main memory block 313. On the contrary, when the address line $IA_{10}$ is at a logic level 1, the decoder 312 selects the redundant memory block 314 so as to select a corresponding storage address thereof in coordination with the decoder 311.

Referring to FIG. 6B, the external address signal MA is transmitted on the address lines $A_0$–$A_9$ while the internal address signal IA in the memory array 310 is transmitted on the address lines $IA_0$–$IA_{10}$. The external address lines $A_0$–$A_9$ can indicate addresses in the range of 000h–3FFh. Assume that when the memory device 300 is completely manufactured, there are several malfunction addresses, such as 002h and 130h, found in the main memory block 313 by testing. To resolve this problem, the first and second address setting circuits of the address setting circuits 361–36N are set to generate redundant setting address signals corresponding to the failure addresses 002h and 130h, respectively, by laser, and the redundant enable/disable signal REN is activated so as to select the redundant memory block 314. Except for addresses 002h and 130h, the other address in the main memory block 313 can be addressed for data access. If it is required to access data stored in the address 002h, the result signal $CP_1$ of the comparator 371 is activated, and then transmitted to the address coder 332 to generate the address signal RA corresponding to an address 000h and concurrently transmitted to the address selecting control circuit 334. Following the activation of the redundant enable/disable signal REN, the redundant selecting signal RS is activated to force the multiplexer 340 to select the address signal RA on the input terminal B thereof as the address signal IA one the output terminal Y thereof. Moreover, the block selecting signal SA output from the block selecting circuit 350 is also activated to select the redundant memory block 314. As shown in FIG. 6B, when the external address signal MA indicates the address 002h, the address signal MA is converted to the address signal RA serving as the address signal IA corresponding to an address 000, and the block selecting signal SA is activated so as to select a replacement access address in the redundant memory block 314.

Similarly, when the external address signal MA indicates the address 130h, the address signal MA is converted to the address signal RA serving as the address signal IA corresponding to an address 001, and the block selecting signal SA is activated so as to address the redundant memory block 314.

Compared to that of the prior art, the memory device having a redundant memory block according to the invention has the following advantage. That is, the unit of the memory device is estimated by byte, such that a certain defective byte of memory cells in the main memory block can be replaced with a spare byte of memory cells of the redundant memory block. Therefore, the invention not only increases manufacturing yield, but also can efficiently use the redundant memory block.

While the invention has been described by way of example and in terms of the preferred embodiment, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A memory device having a redundant memory block comprising:

a main memory block;

a redundant memory block;

a first decoder electrically coupled to the main memory block and the redundant memory block for receiving a first address signal;

a second decoder electrically coupled to the main memory block and the redundant memory block for receiving the first address signal and a block selecting signal which comprises either a first state or a second state, wherein the second decoder selects the main memory block when the block selecting signal is at the first state, and the second decoder selects the redundant memory block when the block selecting signal is at the second state;

a multiplexer controlled by a redundant selecting signal for receiving a second address signal and a third address signal and transmitting the first address signal, wherein the second address signal is selected as the first address signal when the redundant selecting signal is deactivated, and the third address signal is selected as the first address signal when the redundant selecting signal is activated;

a block selecting circuit electrically coupled to the second decoder for receiving the redundant selecting signal and transmitting the block selecting signal, wherein the block selecting signal is at the first state when the redundant selecting signal is deactivated, and the block selecting signal is at the second state when the redundant selecting signal is activated;

a plurality of address setting circuits for generating a plurality of redundant setting address signals, respectively; and a redundant address generating circuit electrically coupled to the address setting circuits, the block selecting circuit and the multiplexer for receiving the second address signal and transmitting the third address signal and the redundant selecting signal, wherein the corresponding third address signal is transmitted to the multiplexer and the redundant selecting signal is activated when the second address signal is identical to one of the redundant setting address signals.

2. The memory device having a redundant memory block of claim 1, further comprising a redundant setting circuit for transmitting a redundant enable/disable signal to enable/disable the redundant address generating circuit.

3. The memory device having a redundant memory block of claim 2, wherein the redundant setting circuit comprise a fuse which can be broken off by laser and has one end electrically coupled to a ground potential and a resistor of which one end is electrically coupled to a high potential, and the other end is electrically coupled to the other end of the fuse from which the redundant enable/disable signal is transmitted.

4. The memory device having a redundant memory block of claim 2, wherein the redundant address generating circuit comprises:
   a plurality of comparators each for receiving a redundant setting address signal output from a corresponding address setting circuit and the second address signal and transmitting a result signal, wherein the result signal is activated when the redundant setting address signal is identical to the second address signal;
   an address coder having a plurality of input terminals electrically coupled to the output terminals of the comparators for receiving result signals output from the comparators and transmitting the third address signal to the multiplexer, wherein the address coder generates the corresponding third address signal when one of the result signals is activated; and
   an address selective control circuit having a plurality of input terminals electrically coupled to the output terminals of the comparators for receiving the result signals output from the comparators and transmitting the redundant selecting signal, wherein the redundant selecting signal is activated when one of the result signals is activated.

5. The memory device having a redundant memory block of claim 4, wherein the address selective control circuit is further electrically coupled to the redundant setting circuit to receive the redundant enable/disable signal, wherein the address selective control circuit is enabled when the redundant enable/disable signal is activated.

6. The memory device having a redundant memory block of claim 5, wherein the corresponding result signal output from each comparator is activated at a high potential.

7. The memory device having a redundant memory block of claim 6, wherein the redundant enable/disable signal is activated at a high potential.

8. The memory device having a redundant memory block of claim 7, wherein the redundant selecting signal is activated at a high potential.

9. The memory device having a redundant memory block of claim 8, wherein the address selective control circuit comprises an OR gate for receiving the result signals and an AND gate for receiving the output signal of the OR gate and the redundant enable/disable signal and transmitting the redundant selecting signal.

10. The memory device having a redundant memory block of claim 1, wherein the block selecting circuit is a multiplexer having two input terminals to receive a first signal being at a first state and a second signal being at a second state and controlled by the redundant selecting signal, wherein the block selecting circuit selects the first signal as the block selecting signal when the redundant selecting signal is deactivated, and the block selecting circuit selects the second signal as the block selecting signal when the redundant selecting signal is activated.

11. The memory device having a redundant memory block of claim 1, wherein each address setting circuit comprises a plurality of fuses each being able to be broken off by laser and having one end electrically coupled to a ground potential and a plurality of resistors each having one end electrically coupled to a high potential and the other end electrically coupled to the other end of the corresponding fuse to provide a corresponding redundant setting address signal.

12. A memory device having a redundant memory block comprising:
   a main memory block;
   a redundant memory block;
   a first decoder electrically coupled to the main memory block and the redundant memory block for receiving a first address signal;
   a second decoder electrically coupled to the main memory block and the redundant memory block for receiving the first address signal and a block selecting signal which comprises either a first state or a second state, wherein the second decoder selects the main memory block when the block selecting signal is set at the first state, and the second decoder selects the redundant memory block when the block selecting signal is at the second state; and
   an address control circuit generating a plurality of redundant setting address signals therein for receiving a second address signal and transmitting the first address signal and the block selecting signal, wherein the second address signal serves as the first address signal and the block selecting signal is at the first state when the second address signal is not identical to any one of the redundant setting address signals, and the second address signal is converted then to serve as the corresponding first address signal, and the block selecting signal is set at the second state when the second address signal is identical to one of the redundant setting address signals.

13. The memory device having a redundant memory block of claim 12, wherein the address control circuit comprises:
   a plurality of address setting circuits for generating a plurality of redundant setting address signals, respectively;
   a plurality of comparators each for receiving a redundant setting address signal output from a corresponding address setting circuit and the second address signal and transmitting a result signal, wherein the result signal is activated when the redundant setting address signal is identical to the second address signal;
   an address coder having a plurality of input terminals electrically coupled to the output terminals of the comparators for receiving result signals output from the comparators and transmitting the third address signal to the multiplexer, wherein the address coder generates the corresponding third address signal when one of the result signals is activated;
   an address selective control circuit having a plurality of input terminals electrically coupled to the output terminals of the comparators for receiving the result signals output from the comparators and transmitting the redundant selecting signal, wherein the redundant selecting signal is activated when one of the result signals is activated;
   a multiplexer controlled by a redundant selecting signal for receiving a second address signal and a third address signal and transmitting the first address signal, wherein the second address signal is selected as the first address signal when the redundant selecting signal is deactivated, and the third address signal is selected as the first address signal when the redundant selecting signal is activated; and a block selecting circuit electrically coupled to the second decoder for receiving the redundant selecting signal and transmitting the block selecting signal, wherein the block selecting signal is at the first state when the redundant selecting signal is deactivated, and the block selecting signal is at the second state when the redundant selecting signal is activated.

14. The memory device having a redundant memory block of claim 13, wherein the address control circuit further comprises a redundant setting circuit for transmitting a redundant enable/disable signal to enable/disable the address selecting control circuit.

15. The memory device having a redundant memory block of claim 14, wherein the corresponding result signal outputted from each comparator is activated at a high potential.

16. The memory device having a redundant memory block of claim 15, wherein the redundant enable/disable signal is activated at a high potential.

17. The memory device having a redundant memory block of claim 16, wherein the redundant selecting signal is activated at a high potential.

18. The memory device having a redundant memory block of claim 17, wherein the address selective control circuit comprises an OR gate for receiving the result signals and an AND gate for receiving the output signal of the OR gate and the redundant enable/disable signal and transmitting the redundant selecting signal.

19. The memory device having a redundant memory block of claim 13, wherein the block selecting circuit is a multiplexer having two input terminals to receive a first signal being at a first state and a second signal being at a second state and controlled by the redundant selecting signal, wherein the block selecting circuit selects the first signal as the block selecting signal when the redundant selecting signal is deactivated, and the block selecting circuit selects the second signal as the block selecting signal when the redundant selecting signal is activated.

* * * * *